(12) United States Patent
Sturza et al.

(10) Patent No.: US 9,037,625 B2
(45) Date of Patent: May 19, 2015

(54) MULTI-STANDARD MULTI-RATE FILTER

(75) Inventors: Mark Alan Sturza, Encino, CA (US); Donald Leimer, Rancho Palos Verdes, CA (US)

(73) Assignee: CSR TECHNOLOGY, INC., San Jose, CA (US)

( * ) Notice: Subject to any disclaimer, the term of this patent is extended or adjusted under 35 U.S.C. 154(b) by 457 days.

(21) Appl. No.: 13/441,501

(22) Filed: Apr. 6, 2012

(65) Prior Publication Data
US 2012/0254272 A1 Oct. 4, 2012

Related U.S. Application Data

(63) Continuation of application No. 11/611,542, filed on Dec. 15, 2006, now Pat. No. 8,176,107.

(60) Provisional application No. 60/751,437, filed on Dec. 16, 2005, provisional application No. 60/752,619, filed on Dec. 20, 2005.

(51) Int. Cl.
*H03H 17/02* (2006.01)
*H03H 17/06* (2006.01)

(52) U.S. Cl.
CPC ....... *H03H 17/0279* (2013.01); *H03H 17/0664* (2013.01); *H03H 17/0277* (2013.01)

(58) Field of Classification Search
None
See application file for complete search history.

(56) References Cited

U.S. PATENT DOCUMENTS

| | | |
|---|---|---|
| 4,783,660 A | 11/1988 | Pierce |
| 5,671,168 A | 9/1997 | Liu et al. |
| 5,757,867 A | 5/1998 | Caulfield et al. |
| 6,411,892 B1 | 6/2002 | Van Diggelen |
| 6,417,801 B1 | 7/2002 | Van Diggelen |
| 6,429,814 B1 | 8/2002 | Van Diggelen et al. |
| 6,453,237 B1 | 9/2002 | Fuchs et al. |
| 6,484,097 B2 | 11/2002 | Fuchs et al. |
| 6,487,499 B1 | 11/2002 | Fuchs et al. |
| 6,510,387 B2 | 1/2003 | Fuchs et al. |
| 6,542,820 B2 | 4/2003 | LaMance et al. |
| 6,560,534 B2 | 5/2003 | Abraham et al. |
| 6,606,346 B2 | 8/2003 | Abraham et al. |
| 6,704,651 B2 | 3/2004 | Van Diggelen |
| 2007/0156800 A1 | 7/2007 | Sturza et al. |

OTHER PUBLICATIONS

Response to Non-Final Office Action Mailed May 11, 2011, dated Aug. 4, 2011 for U.S. App. No. 11/611,542, filed Dec. 15, 2006.
Office Action dated Oct. 27, 2011 for U.S. Appl. No. 11/611,542, filed Dec. 15, 2006.
Response to Final Office Action Under 37 C.F.R. § 1.116, dated Dec. 27, 2011 for U.S. Appl. No. 11/611,542, filed Dec. 15, 2006.

(Continued)

*Primary Examiner* — Michael D Yaary
(74) *Attorney, Agent, or Firm* — K&L Gates LLP

(57) ABSTRACT

A method is provided for decimating a digital signal by a factor of M and matching it to a desired channel bandwidth. The method applies the digital signal input samples to a (M−1) stage tapped delay line, downsamples the input samples and the output samples of each tapped delay line stage by a factor of M, and applies each of the M downsampled sample value streams to M allpass IIR filters, respectively. The M allpass IIR filtered sample streams are then summed and scaled by a factor of 1/M. The result can then be filtered by a digital channel filter.

20 Claims, 9 Drawing Sheets

(56) References Cited

OTHER PUBLICATIONS

Notice of Allowance dated Jan. 17, 2012 for U.S. Appl. No. 11/611,542, filed Dec. 15, 2006.
Kale I et al.: "A High-Fidelity Decimator Chip for the Measurement of Sigma-Delta Modulator Performance," IEEE Transactions of Instrumentation and Measurement, IEEE Service Center, Piscataway, NJ, U.S. vol. 44, No. 5, Oct. 1995, pp. 933-939, XP000535999 ISSN: 0018-9456 p. 934, right-hand column, line 19-line 28; Figures 3, 4.
Living J et al.: "High Performance Distributed Arithmetic FPGA Decimators for Video-Frequency Applications," Electronics, Circuits and Systems, 1998 IEEE International Conference on Lisboa, Portugal Sep. 7-10, 1998, Piscataway, NJ, USA, IEEE, US. vol. 3, Sep. 7, 1988, pp. 487-490, XP010366045, paragraph [0002]; Figure 1.
Martinez H. G. et al.: "A Class of Infinite-Duration Impulse Response Digital Filters for Sampling Rate Reduction," IEEE Transactions on Acoustics, Speech and Signal Processing, IEEE Inc. New York, U.S. vol. ASSP-27, No. 2, Apr. 1979, pp. 154-162, XP000990559, paragraph [0011]; Figures 2-4.
Bellanger M.G. et al.: "Digital Filtering by Polyphase Network: Application to Sample-Rate Alteration and Filter Banks," IEEE Transactions on Acoustics, Speech and Signal Processing, IEEE Inc., New York, U.S. vol. ASSP 24, No. 2, Apr. 1976, pp. 109-114, XP008081118, paragraphs [0011], [0111], [000V]; Figures 1-3, 6B.
International Search Report and Written Opinion mailed Dec. 15, 2006 in Application No. PCT/US2006/062194. (17 pages).

MULTI-STANDARD MULTI-RATE FILTER

CROSS-REFERENCE TO RELATED APPLICATIONS

The present patent application is a continuation of U.S. patent application Ser. No. 11/611,542, filed on Dec. 15, 2006 now U.S. Pat. No. 8,176,107, which application is related to and claims priority of (a) U.S. Provisional Patent Application, entitled "Multi-Standard Multi-Rate Filter," Ser. No. 60/751,437, filed 16 Dec. 2005; and (b) U.S. Provisional Patent Application, entitled "Differential Evolution Design Of Polyphase IIR Decimation Filters," Ser. No. 60/752,619 and filed on 20 Dec. 2005. Each of the foregoing applications is hereby incorporated by reference in its entirety into the present application.

BACKGROUND OF THE INVENTION

1. Field of the Invention

The present invention relates to a high-performance; small die size, and low-power dissipation decimation filter.

2. Discussion of the Related Art

Conventional analog filter solutions require switching between different filters or different filter components when processing information coded according to different standards or different channel bandwidths. For analog filters to achieve the required narrow transition bandwidths and high stopband attenuations, precise component tolerances are required. Precise component tolerances are difficult to achieve on-chip, necessitating the use of off-chip components, thereby resulting in increased system cost. Additionally, temperature compensation and aging are also often required.

Conventional digital filter approaches use finite impulse response (FIR) filters or infinite impulse response (IIR) filters. Conventional FIR filters require large numbers of coefficients to meet the transition band and stopband attenuation requirements. Further, multiple sets of these coefficients are required to support the various coding standards and channel bandwidths. As a result, a large on-chip memory is required. Conventional IIR filters also require many sections to meet such requirements and are sensitive to both coefficient and signal quantization.

For a detailed description of the theory and design of FIR digital filters, see Alan Oppenheimer and Ronald Schafer, Digital Signal Processing (Prentice-Hall 1975), especially chapters 5 and 6. Further information regarding conventional filter design may also be found in:

a Lutovac, M. D. and Milic, L. D., "Design of High-Speed IIR Filters Based on Elliptic Minimal Q-Factors Prototype" ("Lutovac and Milic"), Conf. ETRAN 2002, Banja Vrucica, pp. 103-106 (2002).
 b Lutovac, M. D., Tosic, D. V., and Evans, B. L., "Filter Design for Signal Processing—Using MATLAB and Mathematica", Prentice Hall (2001).
 c Harris, F. J., "Multirate Signal Processing—For Communication Systems", Prentice Hall (2004).
 d Krukowski, A. and Kale, I., "DSP System Design—Complexity Reduced IIR Filter Implementation for Practical Applications" ("Krukowski and Kale"), Kluwer Academic Publishers (2003).
 e Storn, Rainer, "Designing Nonstandard Filters with Differential Evolution" ("Storn"), IEEE SIGNAL PROCESSING MAGAZINE, January 2005.

SUMMARY

According to one embodiment of the present invention, a method is provided for decimating a digital signal by a factor of M and matching it to a desired channel bandwidth. The method applies the digital signal input samples to a (M−1) stage tapped delay line, downsamples the input samples and the output samples of each tapped delay line stage by a factor of M, and applies each of the M downsampled sample value streams to M allpass IIR filters, respectively. The M allpass IIR filtered sample streams are then summed and scaled by a factor of 1/M. The result can then be filtered by a digital channel filter.

The present invention is better understood upon consideration of the detailed description below and the accompanying drawings.

DETAILED DESCRIPTION OF THE PREFERRED EMBODIMENTS

In exemplary embodiments, the present invention provides a multi-standard, multi-ratio decimator with improved performance at a lower cost (e.g., smaller die size) and a lower DC power dissipation than was achieved in previously available decimators. In one such embodiment, a quad-ratio (e.g., 2, 3, 4, and 6), multi-standard (e.g., DVB-T/H, ISDB-T and T-DAB) decimator that provides excellent performance with a minimal number of logic gates and low DC power dissipation is provided.

The present multi-standard, multi-rate filter trades-off power dissipation with performance. Decreasing the sampling rate reduces power dissipation at the expense of increased aliasing distortion. If the adjacent channel interference (ACI) is small, this added distortion may be acceptable. For example, the sampling rate can be adjusted to a smaller multiple of the orthogonal frequency division multiplexing (OFDM) fast Fourier transform (FFT) sampling rate when the ACI is low, and increased to a higher multiple when the ACI is high. In this way power dissipation is reduced, when possible, without performance degradation.

Figure 1:
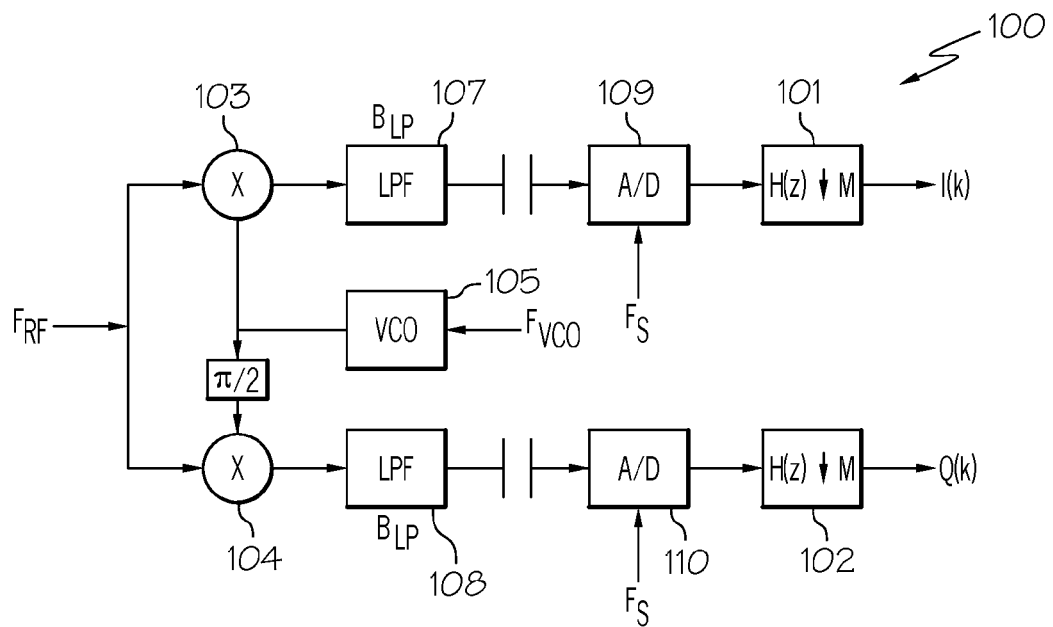
FIG. 1 shows a functional block diagram of a zero-IF/very low-IF (ZIF/VLIF) radio receiver front-end 100.

Referring now to FIG. 1, a functional block diagram of zero-IF/very low-IF (ZIF/VLIF) radio receiver front-end 100 is shown. Multi-standard, multi-rate filters which are configured in accordance with embodiments of the present invention are provided as the final blocks 101 and 102 of the in-phase (I) and quadrature-phase (Q) paths, respectively. The multi-standard, multirate filters 101 and 102 each have transfer function H(z) and decimation ratio M. As shown in FIG. 1, signal $F_{RF}$ denotes the input RF signal applied to mixers 103 and 104 for the I and Q paths, respectively. Mixers 103 and 104 also receive as inputs the output signal of voltage controlled oscillator (VCO) 105 of frequency $F_{VCO}$. VCO 105's signal received at mixer 104 in the Q path is phase-shifted from that received at mixer 103 in the I path by π/2. The output signals of mixers 103 and 104 are applied as input signals to analog low pass filters (LPF) 107 and 108 each of bandwidth $B_{LP}$. Thus, the input RF signal is downconverted to zero 1E, or very-low IF.

The output signals of LPFs 107 and 108 are capacitivly coupled to input signals of analog-to-digital (A/D) converters 109 and 110 to remove DC offsets. The A/D converters sample and quantize their input signals at a sampling rate of $F_S$. The resulting sampled and quantized signals are digitally filtered and decimated by multi-standard, multi-rate filters 101 and 102 to provide the respective I(k) and Q(k) output signals.

Figure 2:
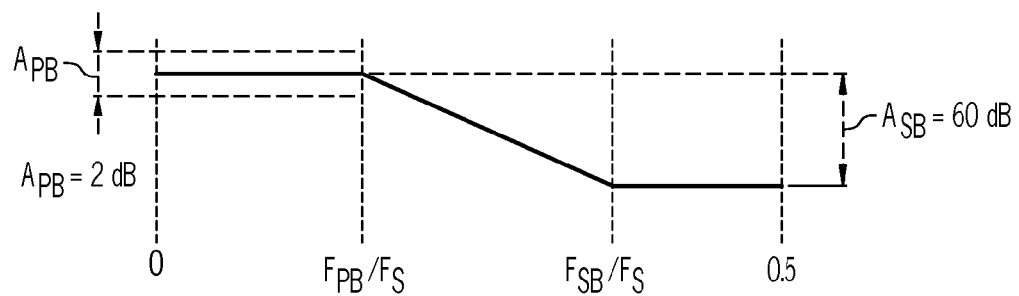
FIG. 2 is a graph illustrating aspects of the filter requirements in relation to the components of the ZIF/VL1F radio front-end.

FIG. 2 is a graph illustrating various aspects of the filter requirements in relation to other components of the ZIF/VLIF radio. As shown in FIG. 2, frequency $F_{PB}$ denotes the passband bandwidth, frequency $F_{SB}$ is the frequency at the high frequency edge of the stop-band, and frequency $F_S$ is the A/D sampling rate, amplitude $A_{PB}$ is the allowable passband ripple, and amplitude $A_{SB}$ is the required stopband attenuation.

Figure 3:
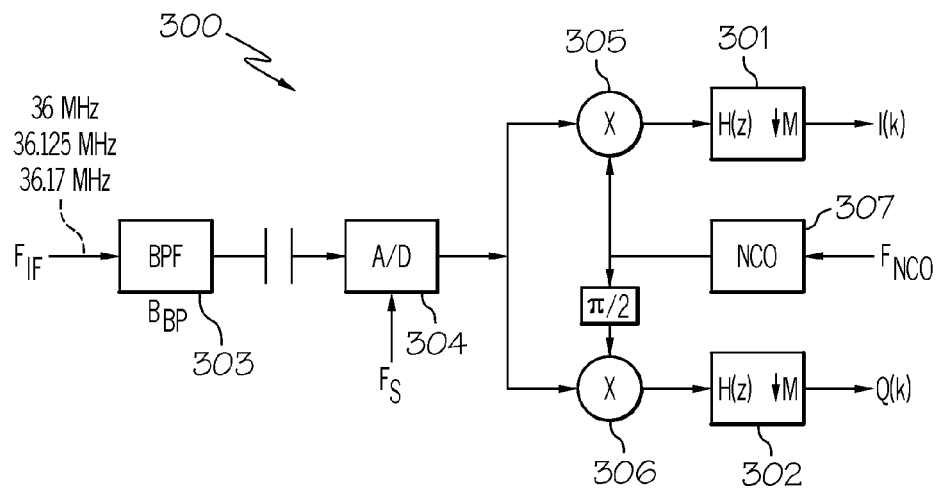
FIG. 3 is a functional block diagram of IF sampling radio receiver front-end 300, in accordance with an alternate embodiment of the present invention.

FIG. 3 is a functional block diagram of IF sampling radio receiver front-end 300, in accordance with an alternate embodiment of the present invention. As shown in FIG. 3, multi-standard multi-rate filters 301 and 302 are the final blocks of the in-phase (I) and quadrature-phase (Q) paths, each having transfer function H(z) and decimation ratio M. In this embodiment, an input IF signal of frequency $F_{IF}$ (e.g., 36 MHz, 36.125 MHz, and 36.17 MHz) is applied to an IF bandpass filter (BPF) 303 of bandwidth $B_{BP}$. The resulting bandpass signal is capacitivly coupled to A/D converter (of sample rate $F_s$) 304 to remove DC offsets.

A/D converter 304 samples and quantizes the bandpass signal of bandpass filter 303, and provides as input samples to digital mixers 305 and 306 of the I and Q paths. In this case, digital mixers 305 and 306 each also receive as an input digital signal an output digital signal of numerically controlled oscillator (NCO) 307, which receives a digital word $F_{NCO}$, representing the NCO frequency. As in IF sampling receiver 100, NCO 307's output signal to the Q path mixer 306 is phase-shifted by π/2 from that of the input signal to mixer 305 of the I path. The sampled and quantized IF samples are thus multiplied by the sine and cosine of NCO 307's output phase, respectively. The resulting samples are digitally filtered, and decimated by multi-standard, multi-rate filters 301 and 302 to provide the baseband samples.

Digital M-path polyphase infinite impulse response (IIR) filters are suitable for use in decimators with decimation ratio M, for M greater than 1. The M-path polyphase IIR filters are based on an M-tap finite impute response (FIR) filter in which the coefficients are replaced by allpass filters. Polyphase IIR filters provide high stopband attenuation and low passband ripple with a relatively small number of coefficients.

Figure 4:
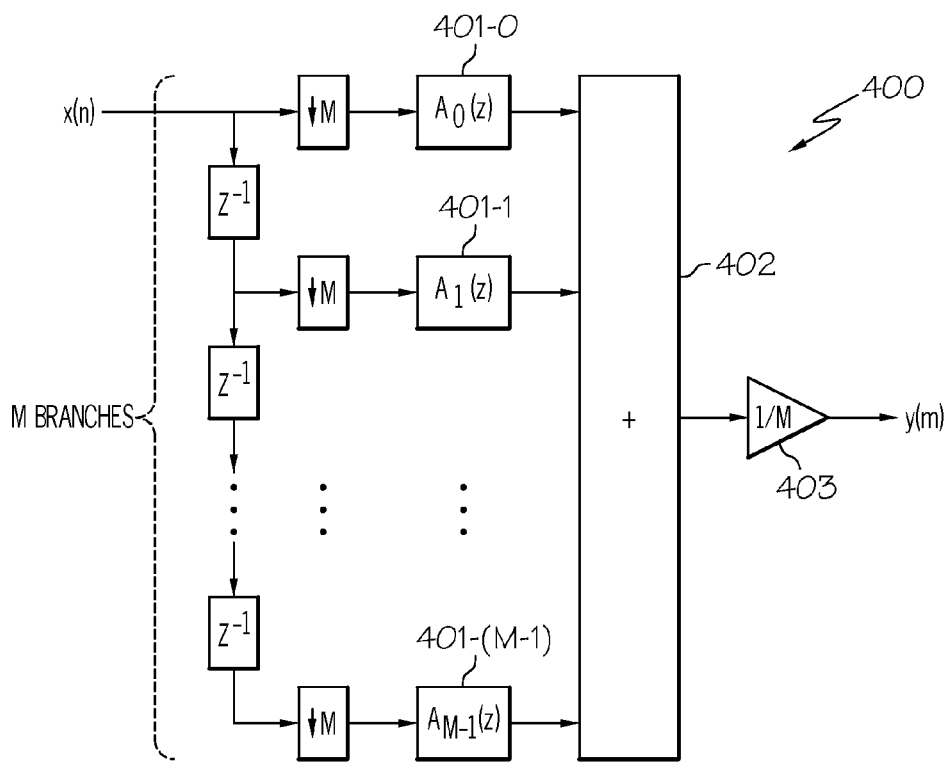
FIG. 4 shows an example of an M-path polyphase IIR decimate-by-M filter structure 400.

FIG. 4 shows an example of an M-path polyphase IIR decimate-by-M filter structure 400. As shown in FIG. 4, input sample x(n) is applied to an M−1 stage, tapped delay line. The input sample and the output signals of the M−1 delay line taps are each downsampled by a factor of M. The M downsampled values are input signals to M allpass filters 401-0, 401-1, ..., 401-(m−1). The filter output signals are summed in summer 402 and scaled by 1/M scaler 403 to provide output samples y(m). The transfer function of the M-path polyphase IIR decimator 400 is given by:

$$H(z) = \frac{1}{M} \sum_{k=0}^{M} z^{-k} A_k(z^M)$$

Assuming that each of the M allpass filters 401-0, 401-1, ..., 401-(m−1) has N cascaded real sections (i.e. N coefficients), the transfer functions of the allpass filters 401-0, 401-1, ..., 401-(m−1) each have the form:

$$A_k(z) = \prod_{j=1}^{N} \frac{\beta_{k,j} + z^{-1}}{1 + \beta_{k,j} z^{-1}}$$

Substituting the allpass filter transfer functions into the M-path polyphase IIR decimator 400's transfer function then gives:

$$H(z) = \frac{1}{M} \sum_{k=0}^{M} z^{-k} \prod_{j=1}^{N} \frac{\beta_{k,j} + z^{-M}}{1 + \beta_{k,j} z^{-M}}$$

Thus, the total number of filter coefficients in this example is M×N.

Figure 5:
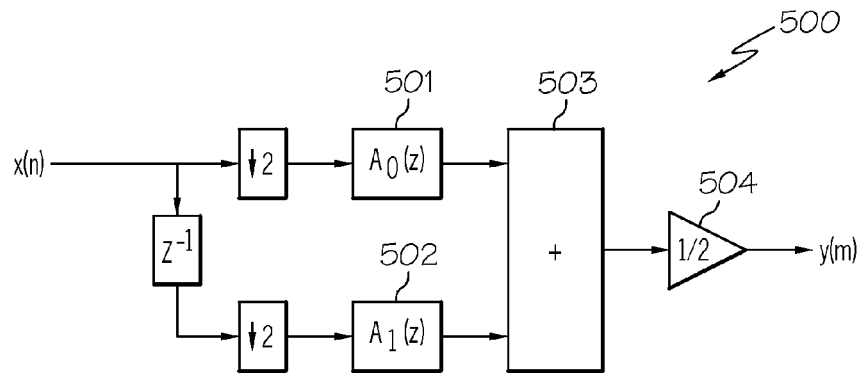
FIG. 5 shows half-band, 2-path polyphase IIR decimator structure 500 configured in accordance with one embodiment of the present invention.

To illustrate some of the polyphase IIR decimators of the present invention, FIG. 5 shows a half-band, 2-path polyphase IIR decimator structure 500, configured in accordance with one embodiment of the present invention. As shown in FIG. 5, input samples x(n) are decimated by 2 and applied as input samples to allpass filter 501. Concurrently, the input samples are delayed by one sample, decimated by 2, and applied as input samples to allpass filter 502. Output signals of filters 501 and 502 are summed in summer 503 and scaled by ½ at scaler 504 to provide the output samples y(n).

Figure 6:
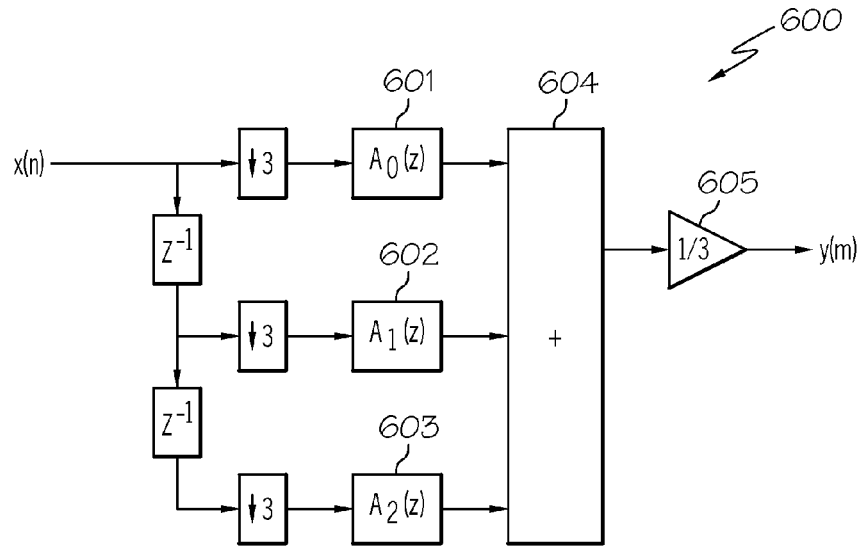
FIG. 6 shows third-band, 3-path polyphase IIR decimator structure 600, configured in accordance with one embodiment of the present invention.

Similarly, FIG. 6 shows third-band, 3-path polyphase IIR decimator structure 600, configured in accordance with one embodiment of the present invention. As shown in FIG. 6, input samples x(n) are decimated by 3 and applied to allpass filter 601. The input samples are also delayed by one sample, decimated by 3, and applied to allpass filter 602. Further, the input samples are delayed by two samples, decimated by 3, and applied to allpass filter 603. The filter outputs of allpass filters 601-603 are then added together by summer 604 and scaled by ⅓ to form output samples y(n).

Figure 7:
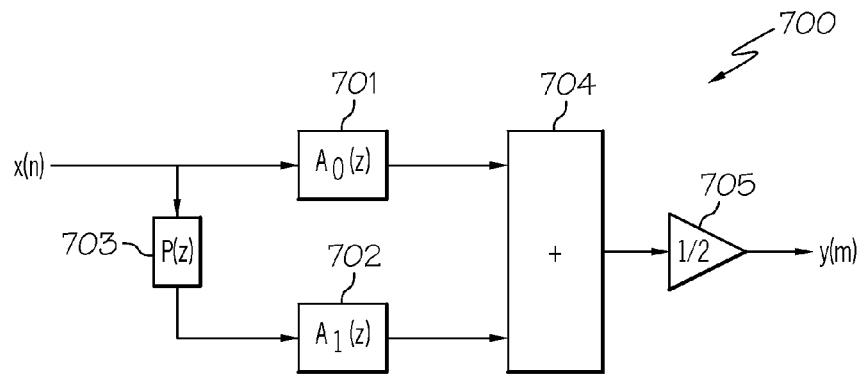
FIG. 7 shows generalized 2-path polyphase IIR filter structure 700, configured in accordance with one embodiment of the present invention.

FIG. 7 shows generalized 2-path polyphase IIR filter structure 700, configured in accordance with one embodiment of the present invention. As shown in FIG. 7, input samples x(n) are applied to allpass filter 701, and filtered by P filter 703. The filtered samples are applied as input samples to allpass filter 702. The filtered output samples of allpass filters 701 and 702 are added together in summer 702 and scaled by ½ in scaler 705 to provide output samples y(n).

Figure 8:
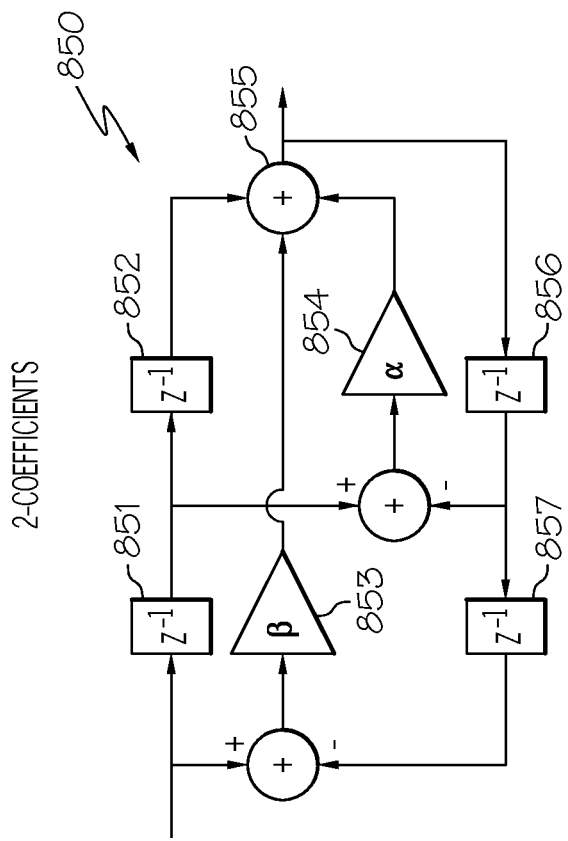
FIG. 8 shows respective 1-coefficient ("real") section and a 2-coefficient ("complex") section IIR allpass filter structures 800 and 850, respectively, configured in accordance with embodiments of the present invention.
Figure 8:
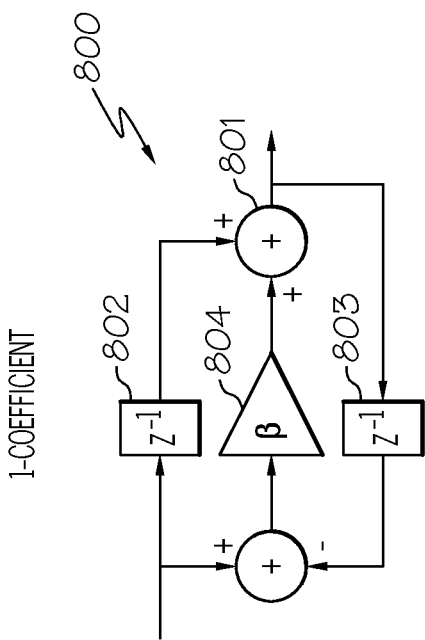

To illustrate the transfer function of the allpass filters of the present invention, FIG. 8 shows 1-coefficient ("real section") and a 2-coefficient ("complex section") IIR allpass filter structures 800 and 850, respectively, configured in accordance with embodiments of the present invention. As shown in FIG. 8, for 1-coefficient filter 800, the input samples are delayed in element 802 by one sample and added in summer 801 to a scaled difference (by $\beta$) between the input samples and samples fed back from the output of IIR allpass filter 800. The samples fed back from the output of IIR allpass filter 800 are delayed in element 803 by one sample.

For 2-coefficient filter 850, the input samples are delayed two samples, and summed in summer 855 with the output samples of scaling element (by $\beta$) 853 and the output samples of scaling element (by $\alpha$) 854 to provide the filter output samples. The input samples to scaling element 853 are the differences between the input samples of the 2-coefficient filter 850 and the output samples of the filter, delayed by two samples. The input samples to scaling elements 854 are the differences between the output samples of the 2-coefficient filter, delayed one sample, and the input samples of 2-coefficient filter 850, delayed one sample.

Figure 9:
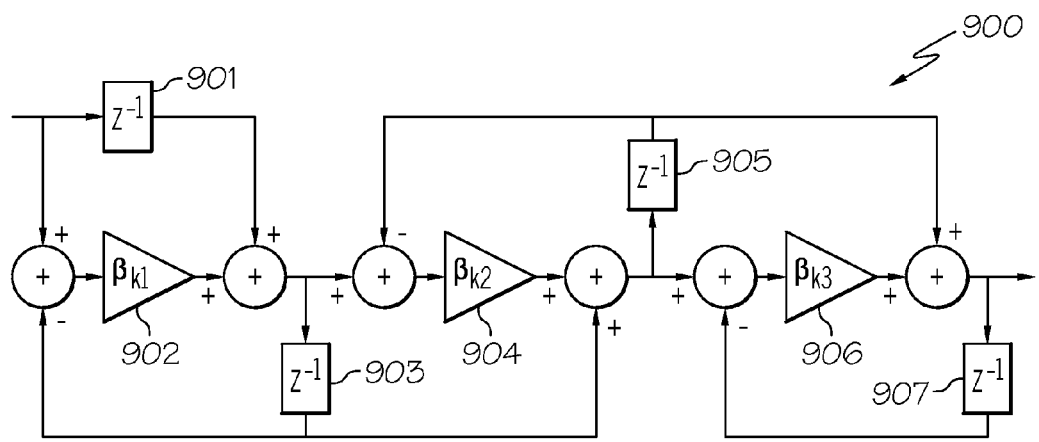
FIG. 9 shows 3-coefficient filter 900 which is formed by cascading 3 real sections.

FIG. 9 shows 3-coefficient filter 900 which is formed by cascading three real sections. In FIG. 9, delay elements (e.g., delay elements 903 and 905) are shared between stages.

The texts by Lutovac and Milic, and Krukowski and Kale, discussed above, provide detailed descriptions of the theory and design of N-path polyphase IIR filters. These texts disclose algorithms for computing the required allpass filter coefficients. In real world implementations, these filter coefficients are quantized to a finite number of bits. However, quantization by rounding or truncation results in significant filter performance degradation (e.g., larger passband ripple and smaller stopband attenuation). The rounded or truncated coefficients are typically far from optimal for the constrained number of bits. Algorithms for optimizing quantized filter coefficients include "bit-flipping" and "Downhill Simplex Method," described in Chapter 3 of the Krukowski and Kale text, and "Differential Evolution" (DE) described in the Storn text.

Figure 10:
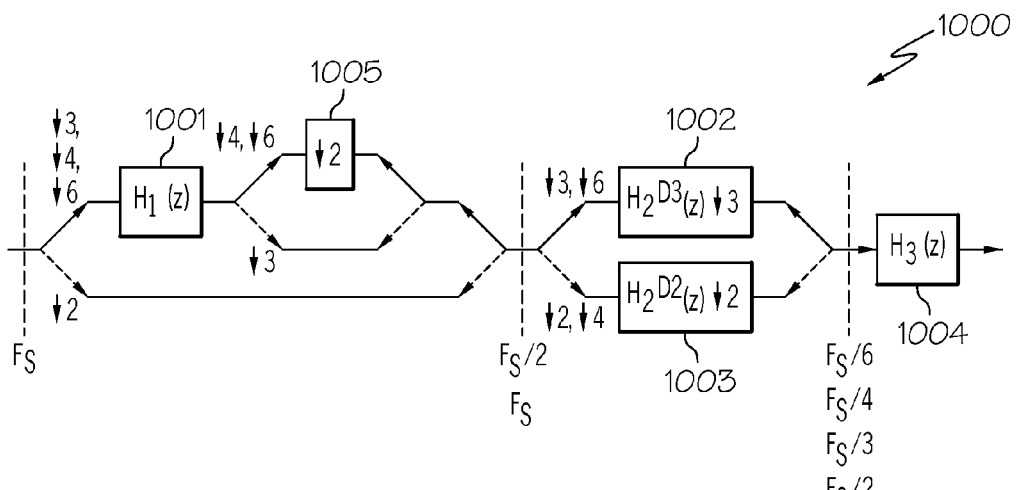
FIG. 10 illustrates quad-ratio (2, 3, 4, and 6) decimator multi-standard filter 1000, configured in accordance with one embodiment of the present invention.

FIG. 10 illustrates quad-ratio (2, 3, 4, and 6) decimator multi-standard filter 1000, configured in accordance with one embodiment of the present invention. As shown in FIG. 10, filter 1000 has an input sample rate of $F_S$ and an output sample rate which is selectable between $F_S/2$, $F_S/3$, $F_S/4$, and $F_S/6$, depending on the path selections through the filter structure.

For decimation by 2, the input samples bypass filter 1001 (with a transfer function labeled "$H_1$") and decimation by 2 filter 1005, pass through filter 1003 (with a transfer function labeled "$H_2^{D2}$", with its associated decimation by 2) and filter 1004 (with a transfer function labeled "$H_3$"). For decimation by 3, the input samples pass through filter 1001 (labeled "$H_1$"), bypass decimation by 2 filter 1005, pass through the filter 1003 (labeled "$H_2^{D3}$", with associated decimation by 3), and pass through filter 1004 (labeled "$H_3$"). Similarly, for decimation by 4, the input samples pass through filter 1001, decimation by 2 filter 1005, filter 1003 (with its associated decimation by 2), and filter 1004. For decimate by 6, the input samples pass through filter 1001 and decimation by 2 filter 1004, filter 1002 (with its associated decimation by 3), and filter 1004.

Table 1 shows examples of filters parameters for a multi-standard, multi-rate filter with component transfer functions $H_1$, $H_2^{D2}$, $H_2^{D3}$, $H_3^{DVB-T}$, $H_3^{ISDB-T}$ and $H_3^{T-DMB}$, configured in accordance with the present invention, for supporting DVB-T (also DVB-H, labeled "$H_3^{DVB-T}$"), ISDB-T (labeled "$H_3^{ISDB-T}$"), and T-DAB (also T-DMB, labeled "$H_3^{T-DMB}$") applications. (The subscript of each transfer function indicates the transfer function's relative position to the other transfer functions; for example, all the $H_2$ filters are in parallel relationship with each other, each receiving input samples from the output of the $H_1$ filter and providing samples to the $H_3$ filters). In Table 1, frequency $F_{PB}$ denotes the pass-band bandwidth, frequency $F_{SB}$ denotes the high-frequency edge of the stopband, and $F_S$ denotes the A/D sampling rate. Table 2 shows quantized filter coefficients that satisfy the requirements shown in Table 1, expressed as hexadecimal fractions and represent various choices of such coefficients for a multi-standard multi-rate filter configured in accordance with the present invention. In Table 2, $A_i$ denotes the transfer function of the IIR filter in the ith path, and each transfer function Ai may be implemented by multiple coefficients.

TABLE 1

| Filter | $F_{PB}/F_S$ | $F_{SB}/F_S$ |
|---|---|---|
| $H_1$ | 0.104 | 0.385 |
| $H_2^{D2}$ | 0.208 | 0.271 |
| $H_2^{D3}$ | 0.139 | 0.180 |
| $H_3^{DVB-T}$ | 0.416 | 0.459 |
| $H_3^{ISDB-T}$ | 0.343 | 0.395 |
| $H_3^{T-DAB}$ | 0.188 | 0.229 |

TABLE 2

| | ρ | $A_0$ Coefficients ($\beta_{0i}, \alpha_{0i}$) | $A_1$ Coefficients ($\beta_{1i}, \alpha_{1i}$) | $A_2$ ($\beta_{2i}$) |
|---|---|---|---|---|
| $H_1$ | | 44h/200h | 127h/200h | — |
| $H_2^{D2}$ | — | 8Ch/800h | 1EDh/800h | 0h/800h |
| | | 398h/800h | 522h/800h | 0h/800h |
| | | 667h/800h | 77Ah/800h | 0h/800h |
| $H_2^{D3}$ | — | 49h/800h | F5h/800h | 216h/800h |
| | | 359h/800h | 493h/800h | 5A6h/800h |
| | | 683h/800h | 746h/800h | 7Beh/800h |

TABLE 2-continued

| ρ | | $A_0$ Coefficients ($\beta_{0i}, \alpha_{0i}$) | $A_1$ Coefficients ($\beta_{1i}, \alpha_{1i}$) | $A_2$ ($\beta_{2i}$) |
|---|---|---|---|---|
| $H_3^{DVB-T}$ | 579h/800h | 431h/800h, B5Eh/800h<br>65Eh/800h, D65h/800h | 538h/800h, C53h/800h<br>774h/800h, E69h/800h | — |
| $H_3^{ISDB-T}$ | 333h/800h | 209h/800h, 6EAh/800h<br>593h/800h, 95Bh/800h | 3C2h/800h, 81Ah/800h<br>732h/800h, A79h/800h | — |
| $H_3^{T-DAB}$ | −10Eh/800h | 131h/800h, −264h/800h<br>595h/800h, −388h/800h | 372h/800h, −2FAh/800h<br>73Eh/800h, −3F6h/800h | |

Figure 11:
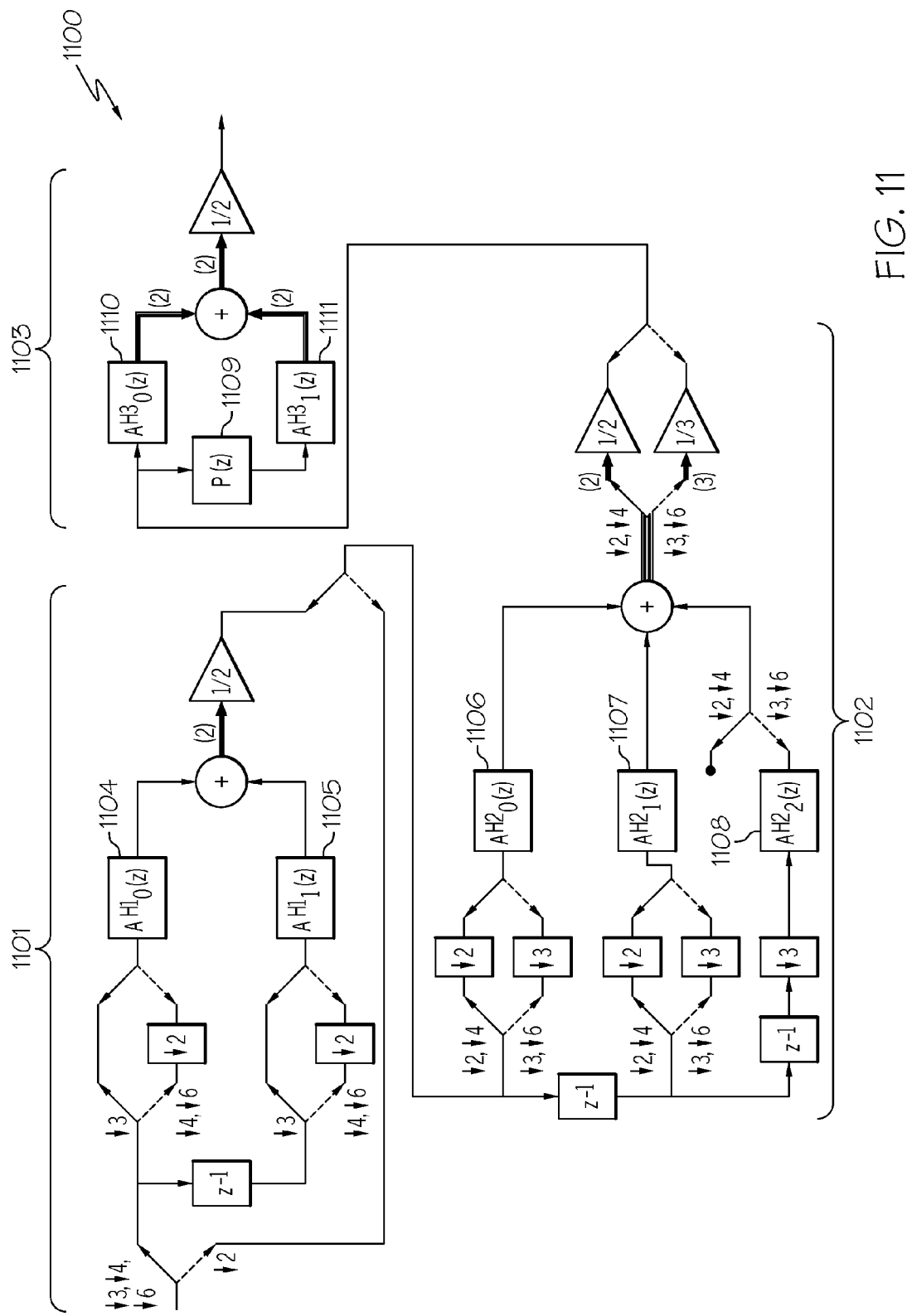
FIG. 11 illustrates quad-ratio (2, 3, 4, and 6) multi-standard decimator structure 1100, configured in accordance with yet a further embodiment of the present invention.

FIG. 11 illustrates quad-ratio (2, 3, 4, and 6) multi-standard decimator structure 1100, configured in accordance with yet a further embodiment the present invention. FIG. 11 represents replacing each of the $H_1$, $H_2$, and $H_3$ filter blocks in FIG. 10 with the appropriate structure from FIG. 4, FIG. 5 and FIG. 6, with all adder outputs truncated to 16-bits, and all paths scaled to ±1 except for the paths labeled (2), which are scaled to ±2, and the paths labeled (3), which are scaled to ±4.

Figure 12:
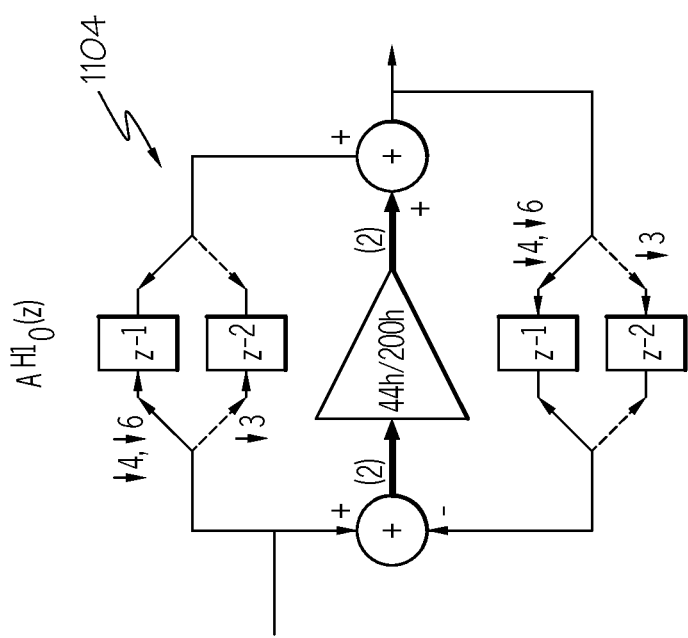
FIG. 12 shows an example of the allpass filter sections of $H_1$ filter 1101 of FIG. 11, configured in accordance with the present invention.
Figure 12:
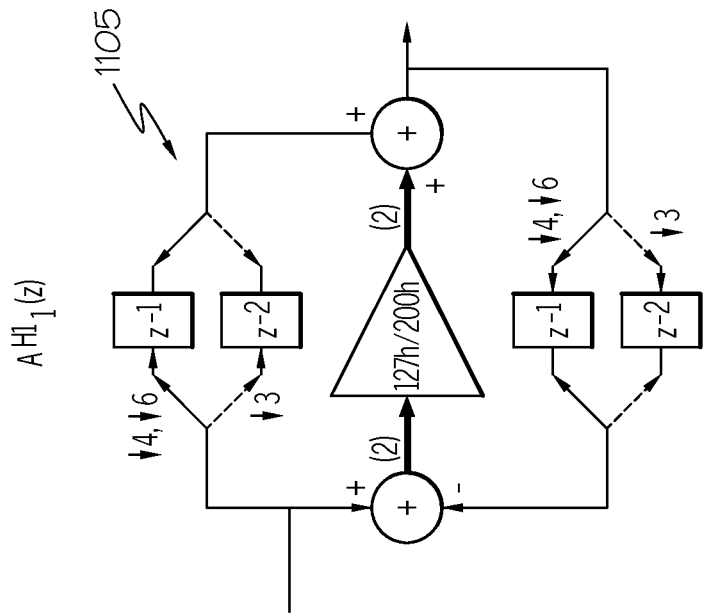

FIG. 12 shows an example of the allpass filter sections 1104 and 1105 of $H_1$ filter 1101 of FIG. 11, configured in accordance with the present invention. As discussed above, the adder outputs are truncated to 16-bits and the paths are scaled to ±1 except for the paths labeled (2), which are scaled to ±2.

Figure 13:
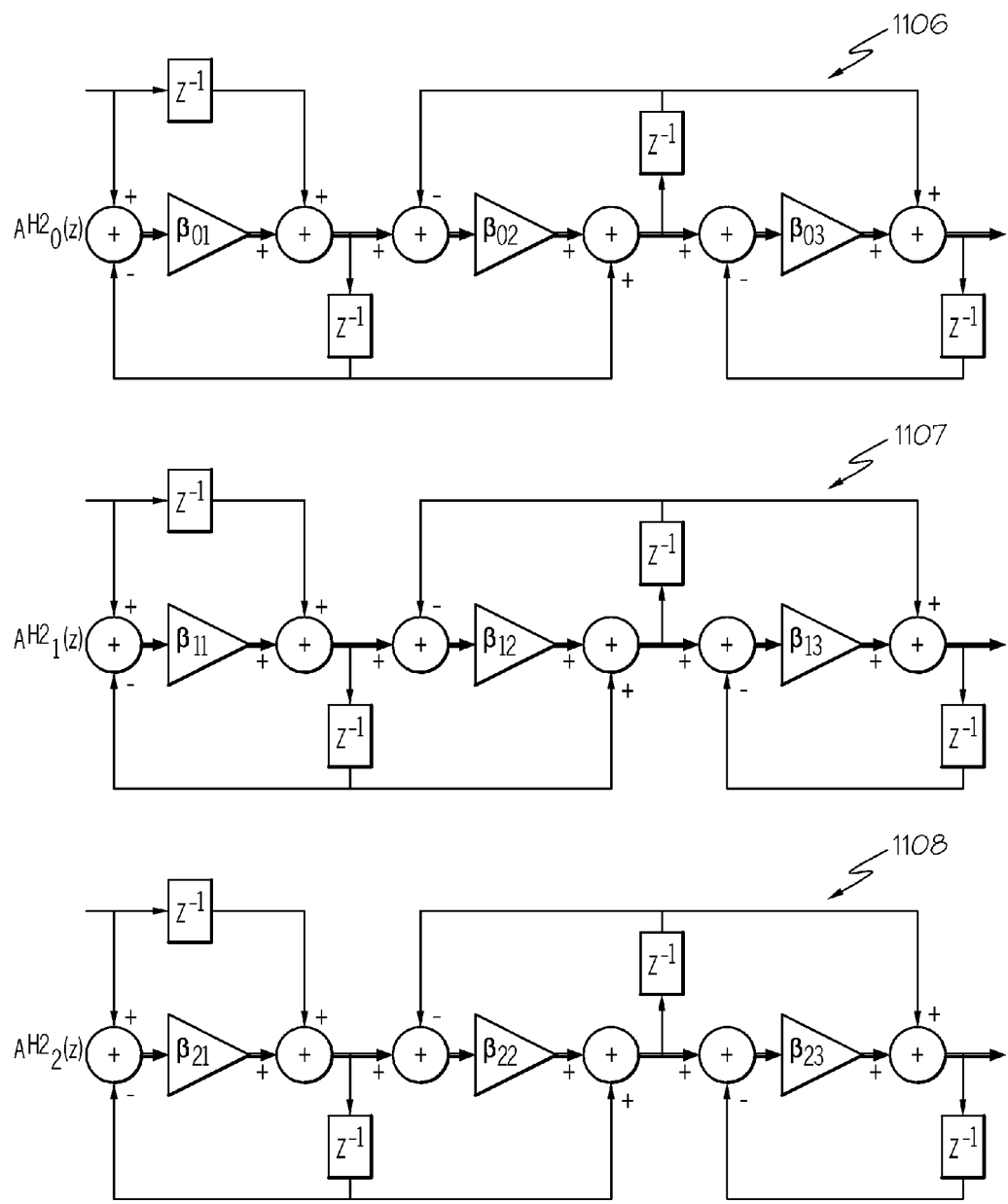
FIG. 13 shows an example of the allpass filter sections 1106, 1107 and 1108 of $H_2$ filter 1102, configured in accordance with the present invention.

FIG. 13 shows an example of the allpass filter sections 1106, 1107 and 1108 of the $H_2$ filter 1102 (i.e., $H_2^{D2}$ and $H_2^{D3}$ filters), configured in accordance with the present invention. As discussed above, the adder outputs are truncated to 16-bits, and the paths are scaled to ±1, except for the inputs and outputs of each of the scaling elements $\beta_{nm}$ (n running from 0 to 2 and m running from 1 to 3), which are scaled to ±2.

Figure 14:
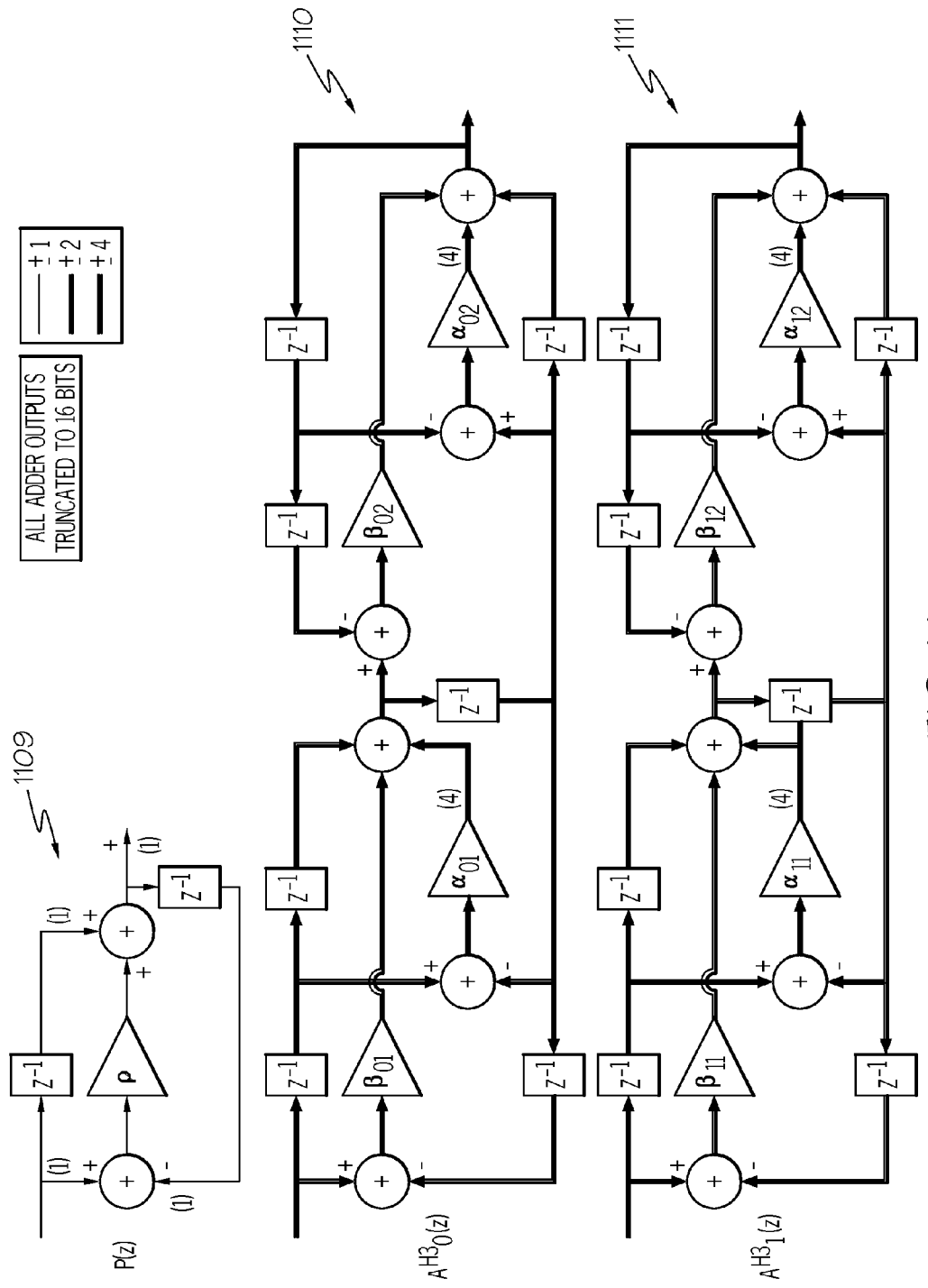
FIG. 14 shows an example of the allpass filter sections 1109, 1110 and 1111 of $H_3$ filter 1102, configured in accordance with the present invention.

FIG. 14 shows an example of the allpass filter sections 1109, 1110 and 1111 of the $H_3$ filter 1102 (i.e., $H_3^{DVB-T}$, $H_3^{ISDB-T}$, and $H_3^{T-DAB}$ filters), configured in accordance with the present invention. As discussed above, the adder outputs are truncated to 16-bits and most paths are scaled to ±2 (as shown by the associated legends), except for those scaled to ±1 or to ±4, as indicated.

Returning now to the zero-IF/very-low IF (ZIF/VLIF) radio receiver front-end 100 shown in FIG. 1, receiver front-end 100 processes broadcast digital multimedia signals in VHF and UHF bands. In the broadcasting community, these frequencies are often referred to as Band I, Band II, Band III, Band IV, Band V, and L-Band.

Receiver front-end 100 is designed for the DVB-T/H, ISDB-T, and T-DAB broadcast digital multimedia standards, each of which uses an OFDM modulation. The DVB-T/H channels are 5, 6, 7, and 8 MHz. The ISDB-T channels are 6, 7, and 8 MHz. The T-DAB channels are approximately 1.7 MHz. By supporting T-DAB, the receiver front-end also supports the T-DMB standard.

Receiver front-end 100 converts RF signals into quantized digital samples with minimal degradation. As shown in FIG. 1, the RF signal is mixed with in-phase and quadrature-phase local oscillator signals from VCO 105 where the difference between the RF frequency and the VCO frequency is either zero (ZIF) or very small (VLIF). The output signals of mixers 103 and 1014 are each lowpass filtered by LPFs 107 and 108 to eliminate the higher frequency sum components, leaving the ZIF or VLIF components.

To simplify filter implementation, thereby reducing die size (cost) and power dissipation, and minimizing signal distortion, the lowpass bandwidth ($B_{LP}$) for LPF 107 and 108 may be selected to be significantly larger than required by the signal bandwidth. For example, in one embodiment, the minimum lowpass bandwidth is one-half of the maximum channel bandwidth (e.g., 4-MHz for an 8-MHz channel). One suitable lowpass filter has a 60-dB bandwidth of 11.5 MHz. The filtered signals are capacitively coupled to A/D converters 109 and 110 to remove any DC offset. A/D converters 109 and 110 sample and quantize the signal at sampling rate $F_S$. The sampling rate should be sufficiently high to prevent aliasing, and be an integer multiple M of the OFDM signals' FFT sampling rates. Approximate sampling rates and integer multiples are shown in Table 3 for an 11.5 MHz $B_{LP}$.

TABLE 3

| Standard | Channel Bandwidth (MHz) | M | $F_S$ (Msps) |
|---|---|---|---|
| DVB-T | 8 | 2 | 18.3 |
| | 7 | 2 | 16.0 |
| | 6 | 3 | 20.5 |
| | 5 | 3 | 17.1 |
| ISDB-T | 8 | 2 | 21.7 |
| | 7 | 2 | 18.9 |
| | 6 | 2 | 16.3 |
| T-DAB | 1.707 | 6 | 12.3 |

After the signals are sampled and quantized at A/D converters 109 and 110, the samples are filtered and decimated by decimators 101 and 102 to obtain samples at the OFDM FFT sampling rate with minimal distortion. Decimators 101 and 102 each have a filter transfer function H(z) and decimate by a factor of M.

Quad-ratio (2, 3, 4, and 6), multi-standard (DVB-T/H, ISDB-T, and T-DAB) decimator (QRMSD) 1100 of FIG. 11 is a suitable filter for implementing each of decimator 101 and 102 of FIG. 1. Similarly, QRMSD 1100 is also a suitable filter for implementing QRMSD filters 301 and 302 of FIG. 3.

As discussed above, decimator 1100 is formed by cascading three filters 1101, 1102 and 1103, having transfer functions $H_1$, $H_2$, and $H_3$, respectively. In some configurations, only one or two of the three filters are required.

As shown above, transfer function $H_1$ can be configured as a half-band, decimate by 2 filter ($H_1^{D2}$), or as a low-pass filter (LPF) $H_1$, by switching in, or out, additional delay elements without changing the coefficients. Transfer function $H_2$ can be configured as either a half-band, decimate by 2 filter ($H_2^{D2}$), or as a third-band, decimate by 3, filter ($H_2^{D3}$), by changing the coefficients. Transfer function $H_3$ can be configured as any one of a DVB-T LPF, $H_3^{DVB-T}$, an ISDB-T LPF, $H_3^{ISDB-T}$, or a T-DAB LPF, $H_3^{T-DAB}$, by changing the coefficients.

The $H_1$ filter may be designed to meet DVB-T's decimate-by-4 requirement (i.e., M=4), which are more stringent then those for the ISDB-T and T-DAB standards. Consequently, the same $H_1$ filter may be used for all three standards. Further, an $H_1$ filter designed for M=4 can also be used for M=6 and M=3, so that the same $H_1$ filter may be used for all standards requiring decimations by 3, 4, and 6.

The $H_2$ filter may be designed to meet the DVB-T requirements, which are again more stringent then those for the ISDB-T and T-DAB standards. In that manner, the same $H_2$ filter may be used for all three standards. The $H_2^{D2}$ filter is substantially identical for M=4 and M=2, and the $H_2^{D3}$ filter is substantially identical for M=6 and M=3. Thus, only one $H_2^{D2}$ and one $H_2^{D3}$ filter are required for all three standards and all decimation ratios 2, 3, 4, and 6.

The H3 stop-band rejection filters are substantially identical for all decimation ratios.

As mentioned above, the filter requirements are shown in Table 1.

As shown in Table 2, single sets of $H_1$, $H_2^{D2}$, and $H_2^{D3}$ filter coefficients, and three sets of $H_3$ filter coefficients are required to support all three standards and all four decimation ratios.

Thus, a multi-standard, multi-ratio decimator has been described.

The detailed description above is provided to illustrate specific embodiments of the present invention and is not intended to be limiting. Many modifications and variations within the scope of the present invention are possible. The present invention is set forth in the following claims.

What is claimed is:

1. A method for decimating a digital signal by a factor of M and matching it to a desired channel bandwidth, comprising:
   a. Applying input samples of said digital signal to an M-1 stage tapped delay line;
   b. Downsampling said input samples and outputs of said tapped delay line stages by a factor of M;
   c. Applying said M downsampled values to M allpass IIR filters where the phase of said M allpass IIR filters add constructively at frequencies below a passband frequency, and add destructively at frequencies above a stopband frequency, and where:
      i. Said passband frequency is less than the input sample rate divided by 2 times M;
      ii. Said stopband frequency is greater than the input sample rate divided by 2 times M;
   d. Summing the outputs of said M allpass IIR filters;
   e. Scaling said sum by a factor of 1/M; and
   f. Applying said scaled sum to a digital channel filter.

2. The method of claim 1 where said allpass IIR filters are realized as 1-coefficient structures.

3. The method of claim 1 where said allpass IIR filters are realized as 2-coefficient structures.

4. The method of claim 1 where said allpass IIR filters are realized as a cascade of 1-coefficient structures.

5. The method of claim 1 where said allpass IIR filters are designed using differential evolution.

6. The method of claim 1 where said digital channel filter is a generalized N-path polyphase IIR filter.

7. A method for selectively decimating a digital signal by a factor equal to the product of any number of the positive integers $M_1$, $M_2$, . . . , and $M_n$, and matching it to a desired channel bandwidth comprising the steps of:
   a. Setting a buffer equal to said digital signal to be decimated;
   b. Setting k equal to 1;
   c. If $M_k$ is in said product, inputting said buffer to the input of an $M_k$-path decimate by $M_k$ method and placing output in said buffer;
   d. Incrementing said k;
   e. If k less than or equal to n, going to step c;
   f. Applying said buffer to a digital channel filter.

8. The method of claim 7 where said $M_k$-path decimate by $M_k$ methods each comprise the following steps:
   a. Applying said buffer input samples to a $M_k$-1 stage tapped delay line;
   b. Downsampling said input sample, and outputs of said tapped delay line stages, by a factor of $M_k$;
   c. Applying said $M_k$ downsampled values to $M_k$ allpass IIR filters each of whose phase responses add constructively at frequencies below a passband frequency, and add destructively at frequencies above a stopband frequency where:
      i. Said passband frequency is less than the input sample rate divided by 2 times $M_k$;
      ii. Said stopband frequency is greater than the input sample rate divided by 2 times $M_k$;
   d. Summing the outputs of said $M_k$ allpass filters;
   e. Scaling said sum by a factor of $1/M_k$.

9. The method of claim 8 where said allpass IIR filters are realized as 1-coefficient structures.

10. The method of claim 8 where said allpass IIR filters are realized as 2-coefficient structures.

11. The method of claim 8 where said allpass IIR filters are realized as a cascade of 1-coefficient structures.

12. The method of claim 8 where said allpass IIR filters are designed using differential evolution.

13. The method of claim 7 where said digital channel filter is a generalized N-path polyphase IIR filter.

14. The method of claim 7 where said decimation ratio is selected based on measured ACI.

15. The method of claim 7 where said decimation ratio is decreased when measured ACI increases.

16. The method of claim 7 where said decimation ratio is increased when measured ACI decreases.

17. A method for decimating a digital signal by a factor of M and matching it to a desired channel bandwidth, comprising:
   applying input samples of the digital signal to an M-1 stage tapped delay line;
   downsampling the input samples of the digital signal and output signals of each of the M-1 tapped delay line stages by a factor of M;
   applying the M downsampled input samples and the M downsampled output signals of each of the M-1 tapped delay line stages to M allpass IIR filters where the phase of the M allpass IIR filters add constructively at frequencies below a passband frequency, and add destructively at frequencies above a stopband frequency; and
   wherein the passband frequency is less than the input sample rate divided by 2 times M; and
   wherein the stopband frequency is greater than the input sample rate divided by 2 times M.

18. The method of claim 17, further comprising summing the outputs of the M allpass IIR filters.

19. The method of claim 18, further comprising scaling the sum of the outputs of the M allpass IIR filters by a factor of 1/M.

20. The method of claim 19, further comprising applying the scaled sum to a digital channel filter.

* * * * *